United States Patent
Horii et al.

(10) Patent No.: US 6,693,978 B1
(45) Date of Patent: Feb. 17, 2004

(54) CARRIER REPRODUCING CIRCUIT

(75) Inventors: Akihiro Horii, Zama (JP); Kenichi Shiraishi, Yokohama (JP)

(73) Assignee: Kabushiki Kaisha Kenwood, Tokyo (JP)

(*) Notice: Subject to any disclaimer, the term of this patent is extended or adjusted under 35 U.S.C. 154(b) by 0 days.

(21) Appl. No.: 09/424,832

(22) PCT Filed: May 20, 1998

(86) PCT No.: PCT/JP98/02203

§ 371 (c)(1),
(2), (4) Date: Dec. 1, 1999

(87) PCT Pub. No.: WO98/56148

PCT Pub. Date: Dec. 10, 1998

(30) Foreign Application Priority Data

Jun. 6, 1997 (JP) ............................. 9-163530

(51) Int. Cl.[7] .......................... H04L 27/14; H04L 27/22
(52) U.S. Cl. ....................................... 375/326; 375/329
(58) Field of Search ................................. 375/329, 324, 375/327, 326, 328, 331, 332; 332/103, 104, 105

(56) References Cited

U.S. PATENT DOCUMENTS

| | | | | |
|---|---|---|---|---|
| 5,289,506 A | * | 2/1994 | Kitayama et al. | 375/344 |
| 5,335,348 A | * | 8/1994 | Kono | 455/192.2 |
| 5,483,686 A | * | 1/1996 | Saka et al. | 455/182.2 |
| 5,485,489 A | * | 1/1996 | Chiba | 375/344 |
| 5,533,059 A | * | 7/1996 | Tsuda | 375/327 |
| 5,684,842 A | | 11/1997 | Daffara | |
| 5,727,027 A | * | 3/1998 | Tsuda | 375/329 |
| 6,023,491 A | * | 2/2000 | Saka et al. | 375/326 |

FOREIGN PATENT DOCUMENTS

| | | |
|---|---|---|
| JP | 63-31222 | 2/1988 |
| JP | 5-308253 | 11/1993 |
| JP | 6-326735 | 11/1994 |
| JP | 7-30602 | 1/1995 |
| JP | 7-46283 | 2/1995 |
| JP | 07-038615 | 2/1995 |
| JP | 7-162470 | 6/1995 |
| JP | 7-177194 | 7/1995 |
| JP | 08-181732 | 7/1996 |
| JP | 10-257117 | 9/1998 |

* cited by examiner

*Primary Examiner*—Don N. Vo
(74) *Attorney, Agent, or Firm*—Eric J. Robinson; Robinson Intellectual Property Law Office, P.C.

(57) ABSTRACT

A carrier reproducing circuit capable of reproducing a carrier quickly, wherein: a signal point arrangement converting circuit (14) detects the signal point arrangement of a demodulating baseband signal of a carrier when the carrier has a frequency different by a predetermined value from the center frequency of the modulated wave; a variance calculating circuit (15) calculates, based on the signal point arrangement, the number of times that the variance exceeds a preset threshold per unit time; a CN determination circuit (16) determines the reception CN ratio based on the number of times; a scanning step frequency width converting circuit (19) sets a frequency width changed by one step based on the determined reception CN ratio; the carrier for demodulating is sent out by changing oscillation frequencies of oscillators (6, 7) through an AFC circuit (20) based on the present frequency width; and when a carrier synchronization judging circuit (18) detects that the number of times decreases to a value equal to or smaller than a threshold determined based on the reception CN ratio, the scanning by the AFC circuit (20) is stopped.

3 Claims, 7 Drawing Sheets

CARRIER REPRODUCING CIRCUIT

FIELD OF THE INVENTION

The present invention relates to a carrier reproducing circuit to be used with a radio receiver or the like of a digital modulation type, and more particularly to a carrier reproducing circuit for reproducing a carrier from a received phase shift keying modulation signal.

BACKGROUND OF THE INVENTION

In this specification, a term "scanning" is used as having the meaning of "frequency sweep" for the reproduction of a demodulation carrier, and a term "scanning frequency width" is used as having the meaning of "a range of the center frequency of a received signal to be covered by a radio receiver." For example, the scanning frequency width of a digital satellite radio receiver is about 1.5 MHz.

In a satellite radio receiver, a carrier is scanned after the power is turned on. When a frame synchronization signal is received during the scanning operation, it is judged that the reception state is in a frame synchronization state, and the scanning operation is stopped and a carrier tracking state enters to use the carrier as a reproduction carrier.

The structures of conventional carrier reproducing circuits are shown in FIGS. 5 to 7. A conventional carrier reproducing circuit shown in FIG. 5 will be described. In the carrier reproducing circuit shown in FIG. 5, a reception wave modulated by phase shift keying is frequency-converted into a predetermined intermediate frequency and input to a quadrature detecting circuit 1A. The quadrature detecting circuit 1A receives a demodulation carrier output from a voltage controlled oscillator (hereinafter described as VCO where applicable) and the demodulation carrier shifted by 90 degrees by a 90° phase shift circuit 121. The quadrature detecting circuit 1A detects baseband signals of I and Q axes from the reception signal converted into the intermediate frequency.

The baseband signals of I and Q axes are supplied to A/D converters 2 and 3 and converted into discrete digital signals whose frequency bands are limited by digital filters 8 and 9. The band-limited baseband signals DI and DQ are supplied to a phase error detecting circuit 122 and to a parallel/serial converter circuit 123. The parallel/serial converter circuit 123 converts the baseband signals DI and DQ into serial data and outputs the serial data.

The phase error detecting circuit 122 detects a phase error from the received baseband signals DI and DQ. A phase error monitor circuit 124 checks whether phase error data corresponding to the detected phase error remains in a steady state, and if in the steady state, outputs a SYNC signal to an AFC circuit 125 to thereby confirm the carrier synchronization.

Until the SYNC signal is supplied to the AFC circuit 125, the AFC circuit 125 continues to output a scanning signal to an adder 126 which adds the scanning signal to the phase error data. The adder 126 supplies the addition output to a D/A converter 127 which converts the addition output into an analog signal which is supplied to a loop filter 128 and smoothed. An output voltage of the loop filter 128 is supplied as a voltage control signal to the voltage controlled oscillator 120 to control the oscillation frequency and scan the carrier. When the AFC circuit 125 receives the SYNC signal, it stops outputting the scanning signal to confirm the carrier synchronization and enter the tracking state dependent upon the phase error data to reproduce the carrier.

In the circuit shown in FIG. 6, a frame synchronizing circuit 129 is used in place of the parallel/serial converter circuit 123 shown in FIG. 5. In this example, until the SYNC signal is supplied from the frame synchronization circuit 129 to the AFC circuit 125, the AFC circuit 125 continues to output the scanning signal to the adder 126 which adds the scanning signal to the phase error data. The adder 126 supplies the addition output to the D/A converter 127 which converts the addition output into an analog signal which is supplied to the loop filter 128 and smoothed.

A smoothed output voltage of the loop filter 128 is supplied as a voltage control signal to the voltage controlled oscillator 120 to control the oscillation frequency and scan the carrier. When the AFC circuit 125 receives the SYNC signal, it stops outputting the scanning signal to confirm the carrier synchronization and enter the tracking state dependent upon the phase error data to reproduce the carrier. These operations are similar to the circuit shown in FIG. 5.

In the carrier reproducing circuit shown in FIG. 7, a quasi-synchronization detecting circuit 1 is used in the carrier reproducing circuit shown in FIG. 6. In the carrier reproducing circuit shown in FIG. 7, a reception wave modulated by phase shift keying is frequency-converted into a predetermined intermediate frequency and input to the quasi-synchronization detecting circuit 1. The quasi-synchronization detecting circuit 1 detects baseband signals of I and Q axes from the reception signal converted into the intermediate frequency.

An output of the adder 126 is supplied to a digital loop filter 130. An output of the loop filter 130 is supplied to numerical control oscillators (NCO in FIG. 7) 6 and 7. A multiplier 4 multiplies an oscillation output of the numerical control oscillator 6 by an output of the A/D converter 2, and a multiplier 5 multiplies an oscillation output of the numerical control oscillator 7 by an output of the A/D converter 3, to thereby perform quadrature detection. The phase of the oscillation output of the numerical control oscillator 6 is made different by 90° from that of the oscillation output of the numerical control oscillator 7.

The baseband signals DI and DQ output from the multipliers 4 and 5 are supplied to digital filters 8 and 9 through which the frequency bands of the baseband signals are limited. The band-limited baseband signals are supplied to the phase error detecting circuit 122 and to the frame synchronizing circuit 129. The frame synchronizing circuit 129 converts the baseband signals DI and DQ into serial data and outputs the serial data.

The phase error detecting circuit 122 detects a phase error from the received baseband signals DI and DQ. Phase error data corresponding to the detected phase error and the scanning output of the AFC circuit 125 are added by the adder 126. This addition output is supplied to the loop filter 130. An output of the loop filter 130 is supplied as oscillation frequency control data to the numerical control oscillators 6 and 7 to control the oscillation frequency and perform the scanning operation.

During the scanning operation, if the frame synchronizing circuit 129 detects a repetition of a synchronization pattern at a predetermined period, the synchronization pattern indicating the top field of the frame data in a series of reception data, then it is judged that the reception state is in a frame synchronization state. Therefore, the SYNC signal is supplied to the AFC circuit 125 to thereby confirm the carrier synchronization. When the AFC circuit 125 receives the SYNC signal, it stops outputting the scanning signal to enter the tracking state dependent upon the phase error data to reproduce the carrier.

One of the above-described conventional carrier reproducing circuits is, however, associated with some problems. Namely, although the carrier scanning is stopped in response to the SYNC signal to be output from the phase error monitor circuit, the reliability of carrier synchronization detection is low if a C/N ratio is low.

The others of the above-described conventional carrier reproducing circuits are, however, associated with some problems. Namely, although the carrier scanning is stopped in response to the SYNC signal to be detected by the frame synchronization circuit, it generally takes several tens frames to detect the SYNC signal so that the time taken to detect the carrier synchronization is long. Therefore, the scanning period by AFC is long.

An object of the invention is to provide a carrier reproducing circuit capable of shortening the time taken to detect the carrier synchronization and quickly reproducing the carrier.

DISCLOSURE OF THE INVENTION

A carrier reproducing circuit of this invention for reproducing a carrier from a received phase shift keying modulation signal, comprises reception means for receiving a demodulation baseband signal when a carrier having a predetermined frequency difference from a modulation wave center frequency is supplied, and change means for sequentially changing an oscillation frequency in order to change a frequency of a demodulation carrier, wherein the reception means controls the change means by supplying the change means with an instruction signal for instructing an activation and a suspension of the change means.

A carrier reproducing circuit of this invention for reproducing a carrier from a received phase shift keying modulation signal, comprises reception CN ratio judging means for judging a reception CN ratio in accordance with the number of discrete values in excess of a predetermined threshold during a unit time period, the discrete values representing a signal point arrangement of a demodulation baseband signal generated when a carrier having a predetermined frequency difference from a modulation wave center frequency is supplied, frequency width converting means for setting a frequency width to be changed by one step, in accordance with the reception CN ratio judged by the reception CN ratio judging means, oscillation means for outputting a demodulation carrier by sequentially changing an oscillation frequency in accordance with the frequency width set by the frequency width converting means, and detecting means for detecting that the number of discrete values reduces to a value equal to or smaller than a threshold determined by the reception CN ratio judged by the reception CN ratio judging means, to prevent the oscillation frequency of the oscillation means from being changed in accordance with the frequency width.

In the carrier reproducing circuit of this invention, the reception CN ratio judging means judges a reception CN ratio in accordance with the number of discrete values in excess of a predetermined threshold during a unit time period, the discrete values representing a signal point arrangement of a demodulation baseband signal generated when a carrier having a predetermined frequency difference from a modulation wave center frequency is supplied, and the frequency width converting means sets a frequency width to be changed by one step, in accordance with the reception CN ratio judged by the reception CN ratio judging means. An oscillation frequency of the oscillation means is sequentially changed in accordance with the set frequency width to output the demodulation carrier, and when it is detected that the number of discrete values reduces to a value equal to or smaller than a threshold determined by the reception CN ratio judged by the reception CN ratio judging means, the oscillation frequency of the oscillation means is prevented from being changed in accordance with the frequency width. Accordingly, the carrier can be reproduced more quickly than the case wherein the oscillation frequency of the oscillation means is prevented from being changed in accordance with the frequency width in response to a detected frame synchronization.

BEST MODE FOR PRACTICING THE INVENTION

Figure 1:
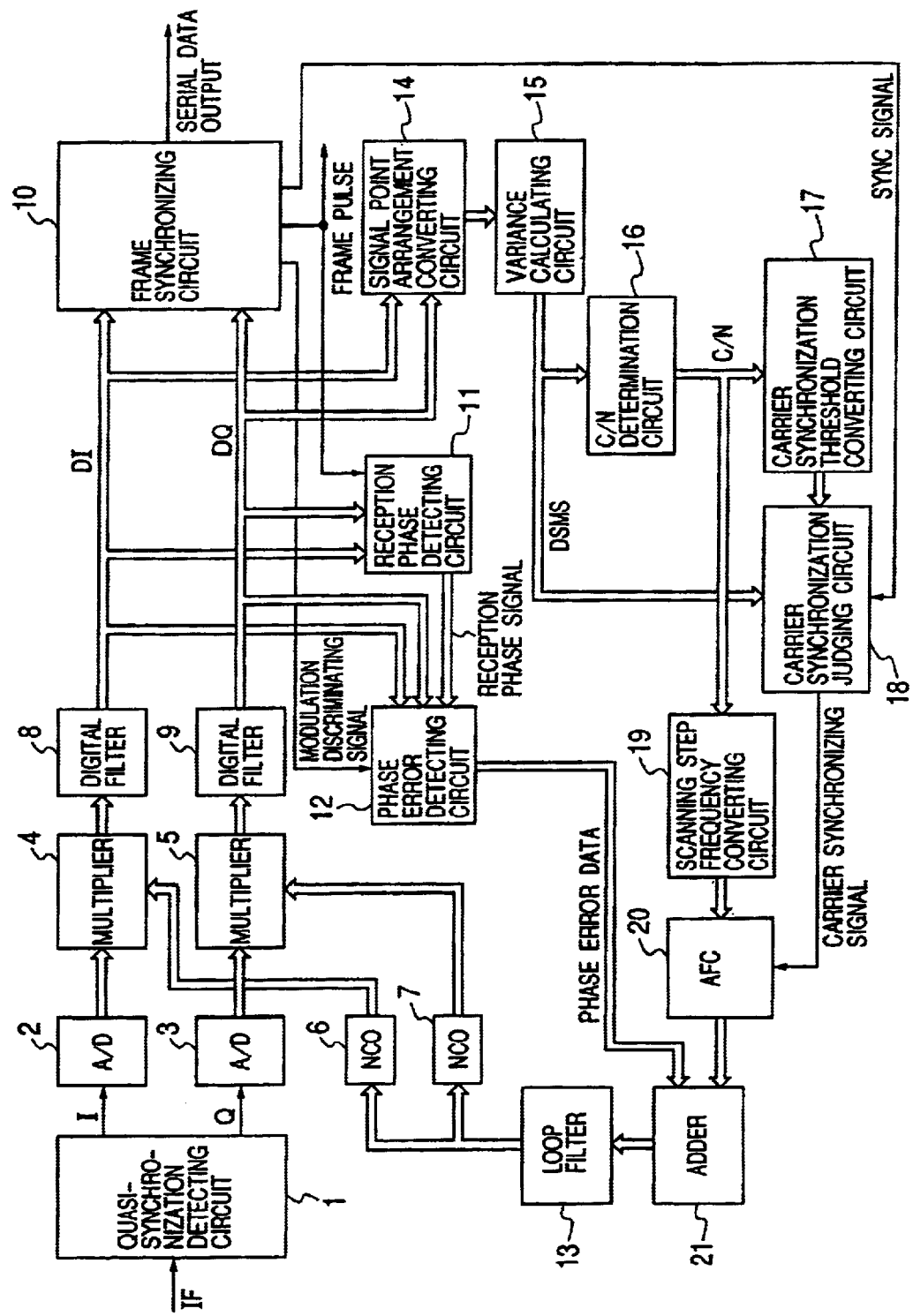
FIG. 1 is a block diagram showing the structure of a carrier reproducing circuit according to an embodiment of the invention.

An embodiment of the carrier reproducing circuit of the invention will be described. FIG. 1 is a block diagram showing the structure of the carrier reproducing circuit according to the embodiment of the invention, this circuit being of a quasi-synchronization detection type.

In this specification, a term "scanning step frequency width" is used as having the meaning of "a frequency width to be changed by one step of the scanning". Similar to a conventional receiver, a satellite radio receiver using the carrier reproducing circuit of the embodiment starts a scanning operation after the power is turned on.

In the carrier reproducing circuit of the embodiment of this invention, a reception signal modulated through phase shift keying is frequency-converted into a predetermined intermediate frequency and input to a quasi-synchronization detecting circuit 1 which converts the reception signal into baseband signals of I and Q axes. The baseband signals of the respective axes are converted into digital discrete signals by A/D converters 2 and 3. The baseband signals of the I and Q axes converted by the A/D converters 2 and 3 are multiplied at multipliers 4 and 5 by an oscillation output of a numerical control oscillator 6 and an oscillation output of a numerical control oscillator 7 phase-shifted by 90° from the oscillator 6, to thereby demodulate the baseband signals.

The bands of the baseband signals DI and DQ output from the multipliers 4 and 5 are limited by digital filters 8 and 9 which supply the baseband signals DI and DQ to a frame synchronizing circuit 10, a reception phase detecting circuit 11 and a phase error detecting circuit 12. The frame synchronizing circuit 10 converts the baseband signals DI and DQ into serial data and outputs it. The frame synchronizing circuit 10 captures a series of data representative of the frame top field already know by the reception and transmission sides.

After a series of data representative of the frame synchronization is captured, the frame synchronizing circuit 10 outputs a frame pulse representative of the top field of the frame to the reception phase detecting circuit 11 and a signal processing circuit at a succeeding stage. The frame synchronizing circuit 10 derives a header, in which transmission frame configuration information is written, from the baseband demodulation signal in response to a timing signal generated from the frame pulse, and outputs a demodulation discriminating signal for discriminating a modulation method, switching between modulation methods and the like to the phase error detecting circuit 12. The modulation discriminating signal and the reception phase data output from the reception phase detecting circuit 11 are used for reliable demodulation even at a low C/N after the carrier is synchronized and the frame synchronization is established.

The frame synchronizing circuit 10 further outputs a SYNC signal if the circuit 10 judges that the frame synchronization has been established, upon detection of a repetition of a synchronization pattern at a predetermined period, the synchronization pattern indicating the top field of the frame data in a series of reception data, i.e., upon detection of a repetition of the frame pulse at the predetermined period.

Phase error data corresponding to a phase error detected by the phase error detecting circuit 12 is supplied to an adder 21 which adds the phase error data and an output from an AFC circuit 20 to be described later. The addition output is smoothed by a digital loop filter 13 and supplied as an oscillation frequency control signal to numerical control oscillators 6 and 7.

Next, a scanning operation to be executed by the AFC circuit 20 of the carrier reproducing circuit of the embodiment of the invention will be described. In the scanning operation to be executed by the AFC circuit 20 of the carrier reproducing circuit of the embodiment of the invention, a substantial CN ratio is obtained from the baseband signals DI and DQ. In accordance with the obtained CN ratio, a scanning step frequency width and a carrier synchronization threshold value are set to execute the scanning operation in accordance with the scanning step frequency width. When the carrier takes a value smaller than the carrier synchronization threshold value, it is judged that the synchronization of the carrier has been established and the scanning operation is stopped.

The scanning operation to be executed by the AFC circuit 20 of the carrier reproducing circuit of the embodiment of the invention will be further detailed. The baseband signals DI and DQ band-limited by the digital filters 8 and 9 are also supplied to a signal point arrangement converting circuit 14 in order to obtain a substantial CN ratio. The signal point arrangement converting circuit 14 refers to a signal point arrangement converting table to obtain signal point arrangement data from the baseband signals DI and DQ. The obtained signal point arrangement data is supplied to a variance calculating circuit 15 which calculates discrete values of the signal point arrangement data.

Next, the signal point arrangement converting table will be described. In the case of QPSK modulation, the base positions of a reception signal (DI DQ) are (0, 0), (0, 1), (1, 1) and (1, 0). (0, 0) is related to the first quadrant, (0, 1) is related to the second quadrant, (1, 1) is related to the third quadrant, and (1, 0) is related to the fourth quadrant. (0, 1) is rotated by 90° in the clockwise direction, (1, 1) is rotated by 180° in the clockwise direction, and (1, 0) is rotated by 90° in the counter-clockwise direction to collect the reception signals (DI, DQ) in the first quadrant and convert the reception signals into signal point arrangement data. Similarly, in the case of 8PSK modulation, reception signals are collected in a predetermined quadrant and converted into signal point arrangement data.

In accordance with the signal point arrangement data obtained by the signal point arrangement converting circuit 14, the variance calculating circuit 15 calculates discrete values of the signal point arrangement data. Each calculated discrete value is compared with a preset standard value A. A total number DSMS of discrete values equal to or larger than the standard value A occurred during a predetermined unit period is calculated. This total number DSMS indicates an occurrence frequency of discrete values equal to or larger than the standard value A during the predetermined unit period.

The total number DSMS calculated by the variance calculating circuit is supplied to a C/N determination circuit 16 and a carrier synchronization judging circuit 18.

Figure 2:
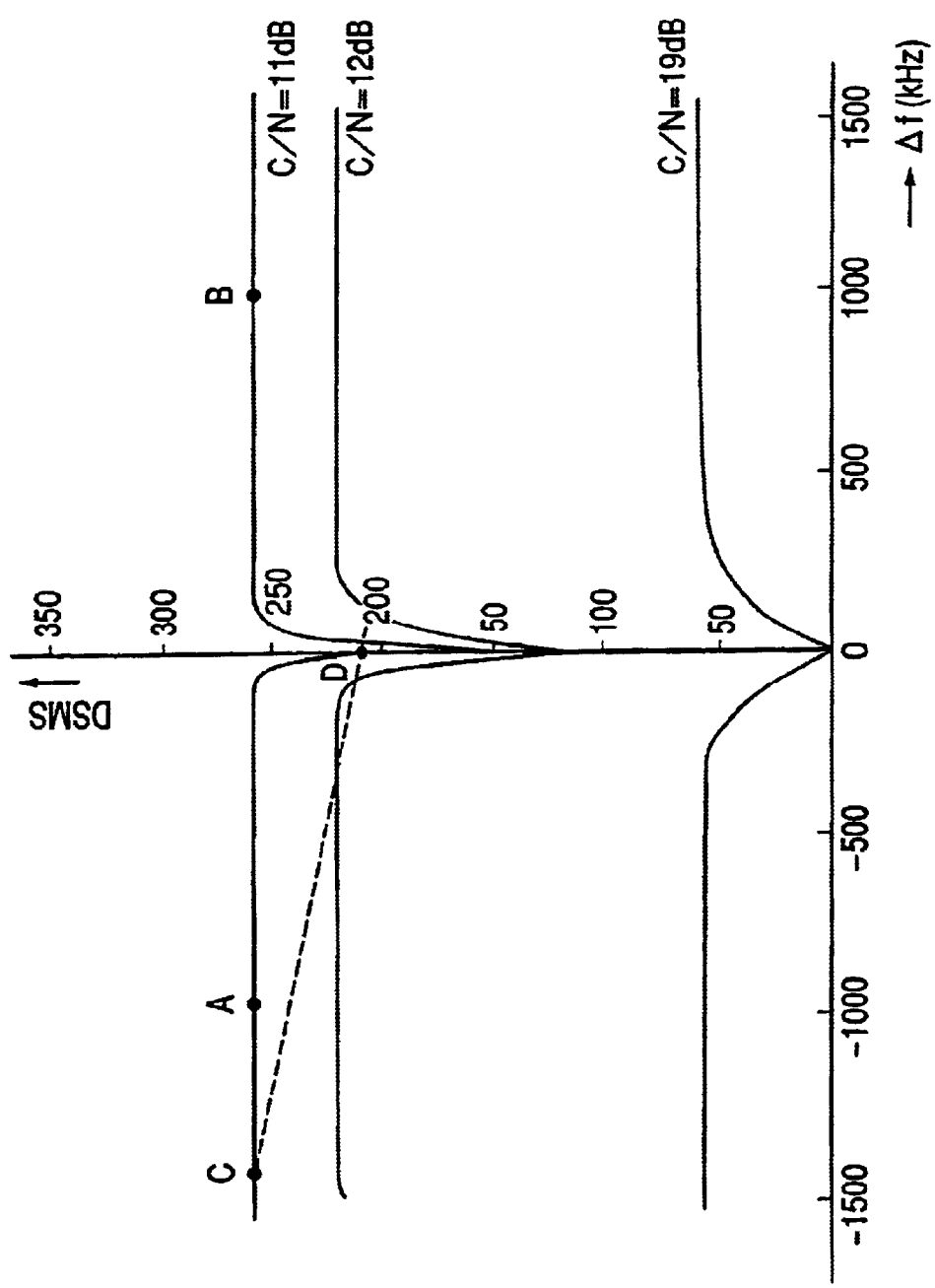
FIG. 2 shows the characteristics of the carrier reproducing circuit of the embodiment, illustrating the operation of the circuit.
Figure 3:
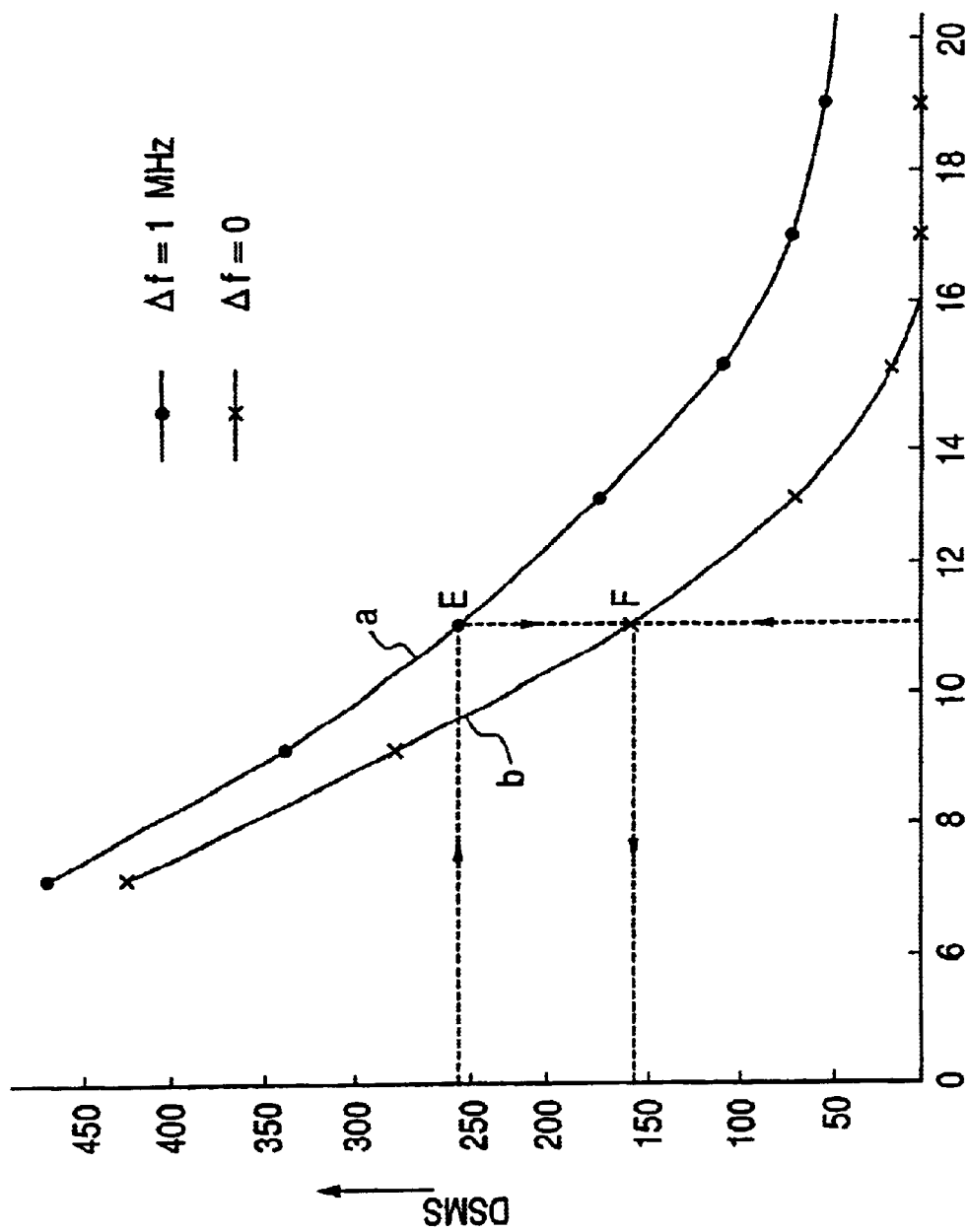
FIG. 3 shows the characteristics of the carrier reproducing circuit of the embodiment, illustrating the operation of the circuit.

Next, the description will be given with reference to FIGS. 2 and 3. FIG. 2 shows the relation among a frequency difference between a modulation wave center frequency and a reproduction carrier frequency, the total number DSMS, and C/N. FIG. 3 shows the relation among the total number DSMS, C/N, and thresholds of the total number DSMS. FIGS. 2 and 3 were obtained through experiments. In FIG. 2, the standard value A for calculating the total number DSMS was set to 1000, and the total number DSMS of discrete values over the standard value A during the predetermined unit period was calculated for C/N=19 dB, C/N=12 dB and C/N=11 dB, relative to the frequency difference between the modulation wave center frequency and the reproduction carrier frequency. A curve a shown in FIG. 3 indicates the relation between the total number DSMS and C/N at the standard value A of 1000 and at the frequency difference of Δf=1 MHz. A curve b shown in FIG. 3 indicates the relation between C/N and the threshold of the total number DSMS at the standard value A of 1000 and at the frequency difference of Δf=0 MHz.

The C/N judging circuit 16 has a table which stores the data of the curve a shown in FIG. 3 indicating the relation between the total number DSMS and C/N at the frequency difference of Δf=1 MHz between the modulation wave center frequency and the reproduction carrier frequency. In accordance with the total number DSMS, C/N of the reception signal is determined. This C/N determined for the reception signal is supplied to the carrier synchronization threshold converting circuit 17 and scanning step frequency width converting circuit 19.

The carrier synchronization threshold converting circuit 17 has a table which stores the data of the curve b shown in FIG. 3 indicating the relation between the total number DSMS and C/N at the frequency difference of Δf=0 between the modulation wave center frequency and the reproduction carrier frequency. In accordance with the total number DSMS and the C/N judged by the C/N judging circuit 16, the threshold of the total number DSMS is obtained and supplied to the carrier synchronization judging circuit 18. When the total number DSMS becomes equal to or smaller than the threshold value of the total number DSMS, the carrier synchronization judging circuit 18 judges that the carrier is in the synchronization state, and outputs a carrier synchronization signal to the AFC circuit 20.

Upon reception of the C/N judged by the C/N judging circuit 16, the scanning step frequency width converting circuit 19 converts the C/N into scanning step frequency width data. The converted scanning step frequency width data is supplied to the AFC circuit 20. In accordance with the scanning step frequency width data, the AFC circuit 20 outputs the scanning data to scan one step after another to the adder 21 which adds it to the phase error data output from the phase error detecting circuit 17. The addition result is supplied via the loop filter 13 to the numerical control oscillators 6 and 7. When the carrier synchronization signal is supplied from the carrier synchronization judging circuit 18, the scanning operation by the AFC circuit 20 is stopped.

In order to judge the C/N and carrier synchronization, predetermined data (data corresponding to a point A shown in FIG. 2) is supplied in advance to the AFC circuit 20 to control the oscillation frequency of the numerical control oscillators 6 and 7 via the adder 21, and is multiplied by the outputs from the A/D converters 2 and 3 at the multipliers 4 and 5 to reproduce the carrier which is then output via the digital filters 8 and 9.

Discrete values are calculated from the signal point arrangement of the baseband signals DI and DQ output from the digital filters 8 and 9. From the discrete values, the total number DSMS is calculated. It is then judged whether the total value DSMS is equal to or smaller than the threshold. If it is judged that the total number DSMS is neither equal to nor smaller than the threshold, predetermined data (corresponding to a point B shown in FIG. 2) is supplied to the AFC circuit to again calculate the total number DSMS.

If one of the A and B points is used, C/N cannot be determined from the total number DSMS in a predetermined frequency range around the center frequency of Δf=0, e.g., in a range of smaller than ±500 kHz. For example, if the total number DSMS is 200, it cannot be judged whether C/N is 11 dB or 12 dB. The absolute frequency of the frequency difference Δf=0 changes depending upon the conditions of the transmission side, a repeater and the like and the conditions of the frequency converter of the receiver and the like. From these reasons, data at the two points A and B is used to set the frequency difference to 1 MHz or larger.

By setting the two points A and B to have a relative frequency difference of 1 MHz or larger, one of the two sample points A and B can have the frequency difference of Δf=500 kHz or larger. As shown by a broken line (C, D) in FIG. 2, one of the two sample points A and B having the larger total number DSMS has the frequency difference Δf equal to or larger than 500 kHz. By adopting the sample point having the larger total number DSMS, it is possible to determine C/N. In the following, it is assumed that C/N is determined as 11 dB. The reception C/N can be judged from the larger total number DSMS if the frequency difference Δf is larger than ±500 kHz as indicated by the broken line in FIG. 2.

The curve a shown in FIG. 3 shows the relation between the total number DSMS and C/N at the frequency difference Δf of 1 MHz, and the curve b shown in FIG. 3 shows the relation between the total number DSMS and C/N at the frequency difference Δf of 1 MHz. If the larger total number DSMS is 260, C/N can be determined as 11 dB at the frequency difference Δf of 1 MHz from the curve b shown in FIG. 3 by tracing from a point E corresponding to the total number DSMS of 260. The threshold of the total number DSMS can be determined as 150 at the frequency difference Δf of 0 MHz from the curve a shown in FIG. 3 by tracing from a point F corresponding to the C/N of 11 dB.

In this manner, the scanning step frequency width converting circuit 19 supplies an optimum scanning step frequency width corresponding to the reception C/N to the AFC circuit 20, whereas the carrier synchronization threshold converting circuit 17 supplies an optimum threshold of the total number DSMS corresponding to the C/N to the carrier synchronization judging circuit 18 which detects the carrier synchronization. Therefore, the scanning operation is executed at the scanning step frequency width and when the total number DSMS becomes equal to or smaller than the threshold of the total number DSMS, it is judged that the carrier synchronization has been established and the scanning operation is stopped.

Figure 4:
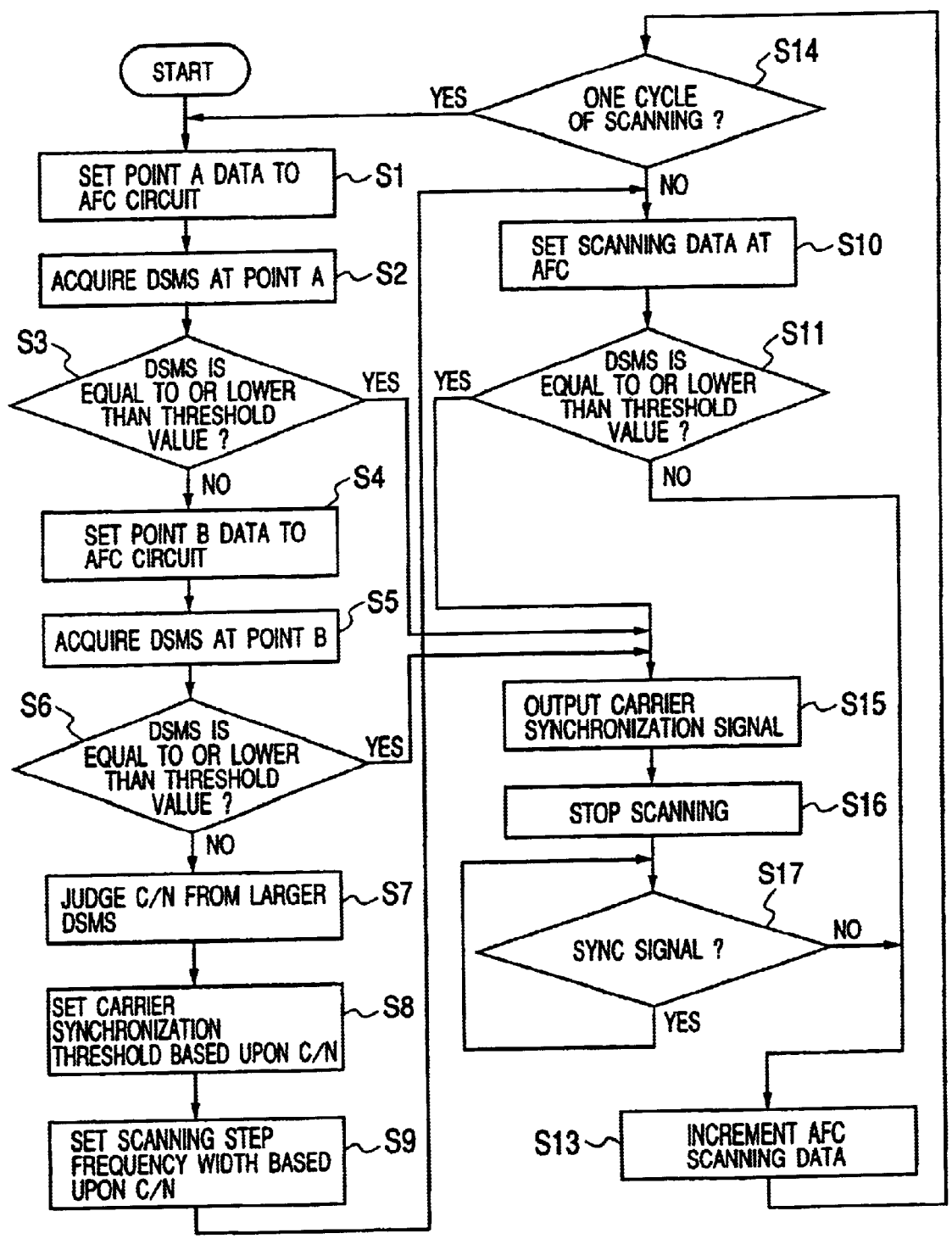
FIG. 4 is a flow chart illustrating the operation of the carrier reproducing circuit of the embodiment.
Figure 5:
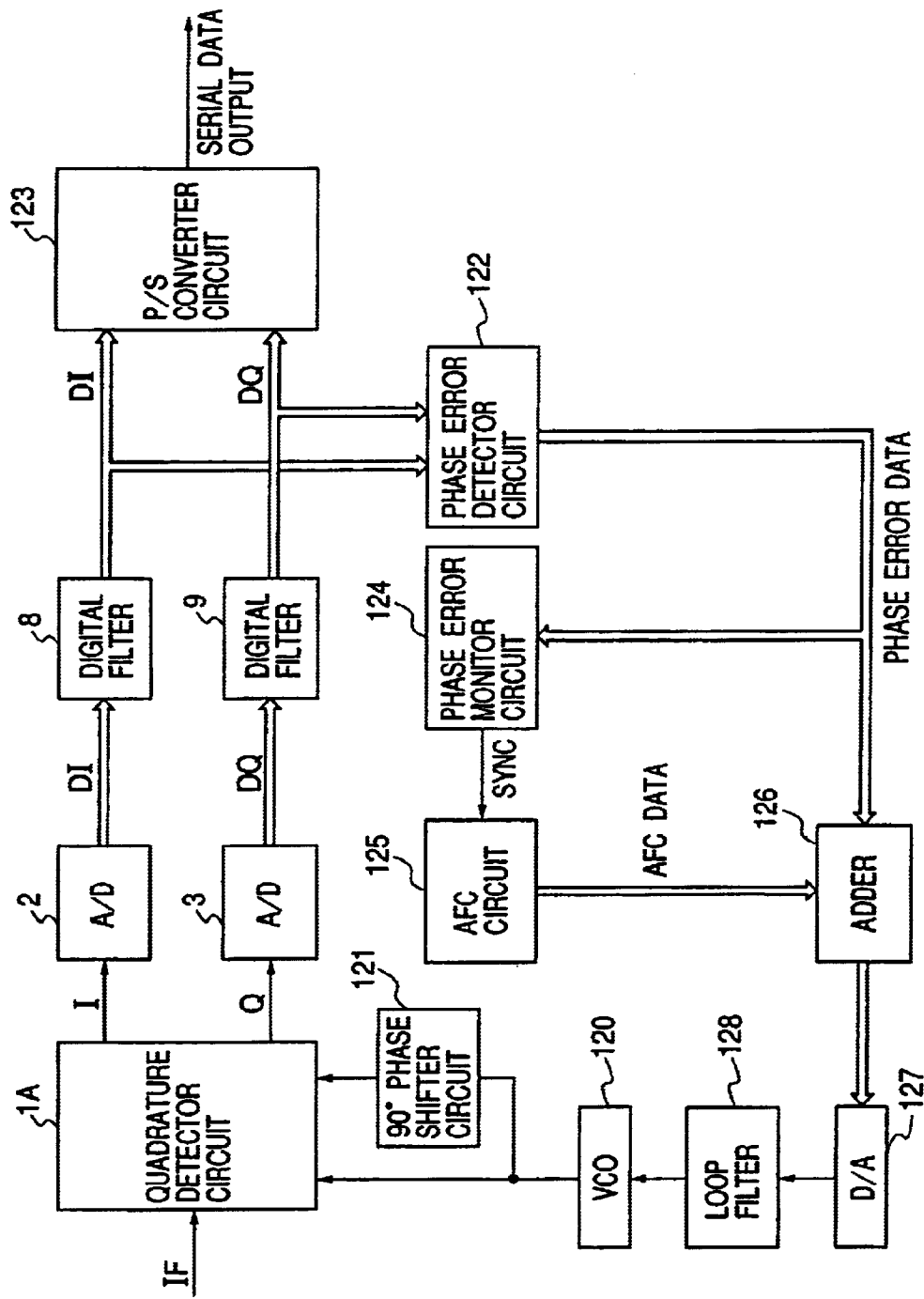
FIG. 5 is a block diagram showing the structure of a conventional carrier reproducing circuit.
Figure 6:
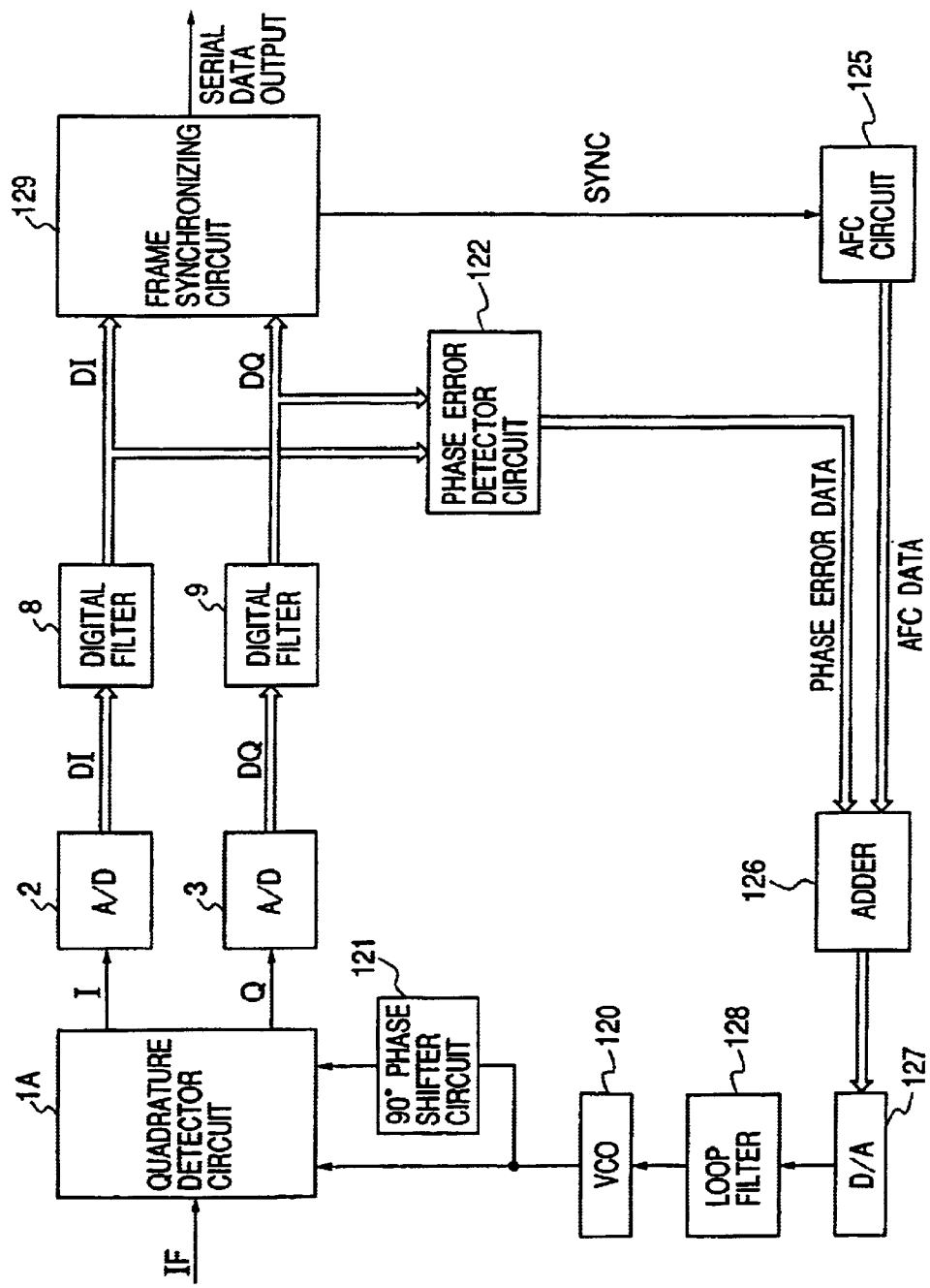
FIG. 6 is a block diagram showing the structure of another conventional carrier reproducing circuit.
Figure 7:
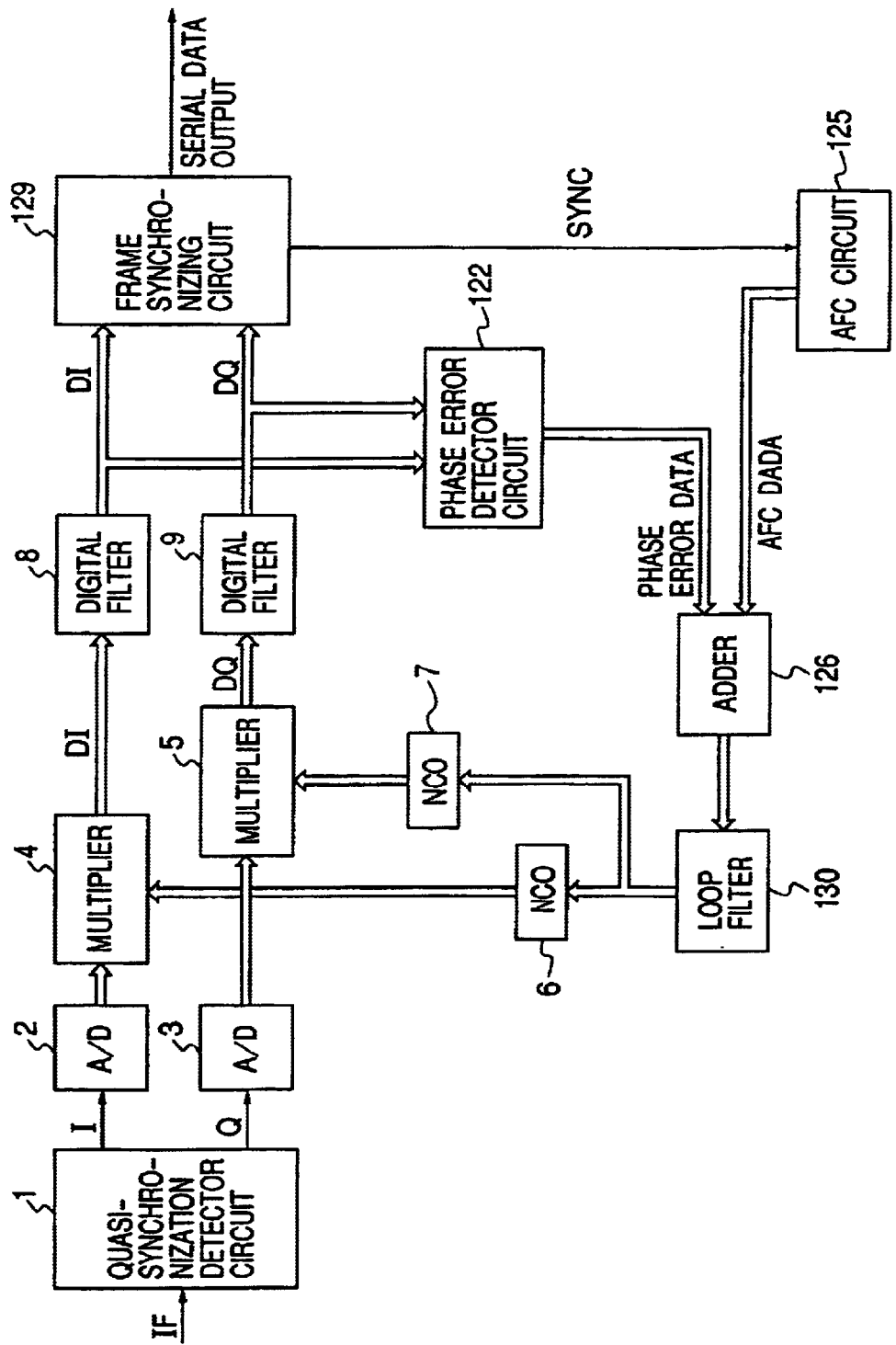
FIG. 7 is a block diagram showing the structure of another conventional carrier reproducing circuit.

The procedure up to the carrier synchronization will be described with reference to the flow chart of FIG. 4.

After the power is turned on, the total numbers at the points A and B are calculated. Data at the point A near which the center frequency of the demodulation output exists is set to the AFC circuit 20 (Step S1). In accordance with the baseband demodulated signals DI and DQ demodulated by oscillation outputs of the numerical control oscillators 6 and 7 and band-limited by the digital filters 8 and 9, the total number DSMS at the point A is calculated (Step S2). It is checked whether the total number DSMS at the point A is equal to or smaller than a predetermined value satisfying the carrier synchronization (Step S3).

If it is judged at Step S3 that the total number DSMS at the point A is equal to or smaller than the predetermined value, it is judged that the carrier synchronization has been established, and the flow advances to Step S15 to be described later. If it is judged at Step S3 that the total number DSMS at the point A is neither equal to nor smaller than the predetermined value, similar to the point A data, data at the point B near which the center frequency of the demodulation output exists is set to the AFC circuit 20 (Step S4), and the total number DSMS at the point B is calculated (Step S5). It is checked whether the total number DSMS at the point B calculated at Step S5 is equal to or smaller than the predetermined value (Step S6).

If it is judged at Step S6 that the total number DSMS at the point B is equal to or smaller than the predetermined value, it is judged that the carrier synchronization has been established, and the flow advances to Step S15 to be described later. After Step S6, C/N of the reception signal is judged from the larger total number DSMS between the total numbers at the points A and B (Step S7). In accordance with C/N judged at Step S7, the carrier synchronization threshold is set (Step S8). As described earlier, the judgement of C/N at Step S7 is made in accordance with the curve a shown in FIG. 3, and the setting of the threshold of the total number DSMS at Step S8 is made in accordance with the curve b shown in FIG. 3.

After Step S8, the scanning step frequency width is set in accordance with the judged C/N (Step S9). The scanning frequency is set at the AFC circuit 20 (Step S10) to start the scanning operation. Next, it is checked whether the total number DSMS is equal to or smaller than the threshold of the total number DSMS (Step S11).

If it is judged at Step S11 that the total number DSMS is neither equal to nor smaller than the threshold of the total number DSMS, the scanning data is incremented by the scanning step frequency width data (Step S13) and it is checked whether one cycle of the scanning was completed (Step S14). If not, the flow returns to Step S10 to repeat the above operations. If it is judged at Step S14 that one cycle of the scanning was completed, the flow returns to Step S1 to repeat the above operations.

If it is judged at Step S11 that the total number DSMS is equal to or smaller than the threshold of the total number DSMS, the carrier synchronization signal is output (Step S15) to stop the scanning operation by the AFC circuit 20 (Step S16). It is then checked whether the frame synchronization detecting circuit 10 outputs the SYNC signal (Step S17).

If it is judged at Step S17 that the SYNC signal was output, Step S17 is repeated. If it is judged at Step S17 that the SYNC signal is not output, the flow advances to Step S13 to repeat the above operations.

In the carrier reproducing circuit of the embodiment of the invention, although the quasi-synchronization detecting circuit 1 is used illustratively, a quadrature detecting circuit 1A may also be used.

INDUSTRIAL APPLICAPABILITY

As described so far, according to the carrier reproducing circuit of this invention, it is possible to detect the synchronization of a carrier from the calculation result of baseband demodulation signals, more quickly than the carrier synchronization during the carrier reproduction using frame synchronization judgement by a frame synchronization detecting circuit. It is therefore possible to reproduce a carrier and search a desired reception signal quickly.

What is claimed is:

1. A carrier reproducing circuit for reproducing a carrier from a received phase shift keying modulation signal, comprising: reception CN ratio judging means for judging a reception CN ratio in accordance with the number of discrete values in excess of a predetermined threshold during a unit time period, the discrete values representing a signal point arrangement of a demodulation baseband signal generated when a carrier having a predetermined frequency difference from a modulation wave center frequency is supplied; frequency width converting means for setting a frequency width to be changed by one step, in accordance with the reception CN ratio judged by said reception CN ratio judging means; oscillation means for outputting a demodulation carrier by sequentially changing an oscillation frequency in accordance with the frequency width set by said frequency width converting means; and detecting means for detecting that the number of discrete values reduces to a value equal to or smaller than a threshold determined by the reception CN ratio judged by said reception CN ratio judging means, to prevent the oscillation frequency of said oscillation means from being changed in accordance with the frequency width.

2. A carrier reproducing circuit according to claim 1, wherein said reception CN ratio judging means comprises: signal point arrangement converting means for converting the demodulation baseband signal into signal point arrangement data, the demodulation baseband signal being generated when the carrier having the predetermined frequency difference from the modulation wave center frequency is supplied; variance calculating means for calculating discrete values from the signal point arrangement data; and counting means for counting the number of discrete values in excess of the predetermined threshold during the predetermined unit period, wherein the reception CN ratio is judged from a count of said counting means.

3. A carrier reproducing circuit according to claim 1, wherein said reception CN ratio judging means comprises: signal point arrangement converting means for converting demodulation baseband signals into signal point arrangement data, the demodulation baseband signals being generated when two carriers having the predetermined frequency differences from the modulation wave center frequency are supplied; variance calculating means for calculating discrete values from the signal point arrangement data of the two carriers; and counting means for counting the number of discrete values of the two carriers in excess of the predetermined threshold during the predetermined unit period, wherein the reception CN ratio is judged from counts of the two carriers counted by said counting means.

* * * * *